US009355725B2

(12) United States Patent
Jin et al.

(10) Patent No.: US 9,355,725 B2
(45) Date of Patent: May 31, 2016

(54) NON-VOLATILE MEMORY AND METHOD OF OPERATING THE SAME

(71) Applicant: Cypress Semiconductor Corporation, San Jose, CA (US)

(72) Inventors: Bo Jin, Cupertino, CA (US); Krishnaswamy Ramkumar, San Jose, CA (US); Xiaojun Yu, Shanghai (CN); Igor Kouznetsov, San Francisco, CA (US); Venkatraman Prabhakar, Pleasanton, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/567,863

(22) Filed: Dec. 11, 2014

(65) Prior Publication Data

US 2015/0170744 A1    Jun. 18, 2015

Related U.S. Application Data

(60) Provisional application No. 61/915,362, filed on Dec. 12, 2013, provisional application No. 62/046,023, filed on Sep. 4, 2014.

(51) Int. Cl.
*G11C 11/34* (2006.01)
*G11C 16/04* (2006.01)
*G11C 16/10* (2006.01)

(52) U.S. Cl.
CPC ............ *G11C 16/0408* (2013.01); *G11C 16/10* (2013.01)

(58) Field of Classification Search
CPC . G11C 16/0433; G11C 16/30; G11C 16/0425

USPC .......................... 365/185.17, 185.25, 185.26
See application file for complete search history.

(56) References Cited

U.S. PATENT DOCUMENTS

| 5,517,061 | A | 5/1996 | Azmanov |
| 6,169,307 | B1 * | 1/2001 | Takahashi et al. ............ 257/315 |
| 6,707,078 | B1 | 3/2004 | Shiraiwa et al. |
| 6,847,556 | B2 | 1/2005 | Cho |
| 6,894,924 | B2 | 5/2005 | Choi et al. |
| 7,091,090 | B2 | 8/2006 | Choi |
| 7,683,404 | B2 | 3/2010 | Jang et al. |
| 7,859,899 | B1 | 12/2010 | Shakeri et al. |
| 8,179,707 | B2 | 5/2012 | Song et al. |
| 8,482,057 | B2 | 7/2013 | Yeh |
| 8,520,440 | B2 | 8/2013 | Ahn et al. |
| 8,542,514 | B1 | 9/2013 | Lakshminarayanan et al. |
| 8,675,405 | B1 | 3/2014 | Georgescu et al. |
| 2004/0041199 | A1 | 3/2004 | Kim |

(Continued)

OTHER PUBLICATIONS

Bez, Roberto, "Introduction to Flash Memory" Proceedings of the IEEE, vol. 91, No. 4, Apr. 2003, pp. 489-502; 14 pages.

(Continued)

*Primary Examiner* — Han Yang

(57) ABSTRACT

A memory structure including a memory array of a plurality of memory cells arranged in rows and columns, the plurality of memory cells including a pair of adjacent memory cells in a row of the memory array, wherein the pair of adjacent memory cells include a single, shared source-line through which each of the memory cells in the pair of adjacent memory cells is coupled to a voltage source. Methods of operating a memory including the memory structure are also described.

11 Claims, 9 Drawing Sheets

(56) References Cited

U.S. PATENT DOCUMENTS

| | | |
|---|---|---|
| 2005/0224861 A1 | 10/2005 | Lee et al. |
| 2006/0030146 A1 | 2/2006 | Helm et al. |
| 2007/0002645 A1 | 1/2007 | Roehr et al. |
| 2007/0063264 A1* | 3/2007 | Huang et al. .......... H01L 27/115 257/321 |
| 2008/0093646 A1 | 4/2008 | Lee et al. |
| 2009/0122613 A1 | 5/2009 | Kim et al. |
| 2009/0180321 A1* | 7/2009 | Torii ..................... 365/185.05 |
| 2010/0172182 A1 | 7/2010 | Seol et al. |
| 2012/0068259 A1 | 3/2012 | Park et al. |
| 2012/0176841 A1 | 7/2012 | Lee et al. |
| 2012/0320652 A1 | 12/2012 | Kono |
| 2013/0016565 A1 | 1/2013 | Park et al. |

OTHER PUBLICATIONS

Kim, Byungcheul, "A Scaled SONOS Single-Transistor Memory Cell for a High-Density NOR Structure with Common Source Lines," Journal of the Korean Physical Society, vol. 41, No. 6, Dec. 2002, pp. 945-948; 4 pages.

International Search Report for International Application No. PCT/US2014/069942 dated Mar. 12, 2015; 2 pages.

Written Opinion of the International Searching Authority for International Application No. PCT/US2014/069942 dated Mar. 12, 2015; 9 pages.

\* cited by examiner

NON-VOLATILE MEMORY AND METHOD OF OPERATING THE SAME

CROSS-REFERENCE TO RELATED APPLICATIONS

This application claims the benefit of priority under 35 U.S.C. 119(e) to U.S. Provisional Patent Application Ser. No. 61/915,362, filed Dec. 12, 2013, and U.S. Provisional Patent Application Ser. No. 62/046,023, filed Sep. 4, 2014, both of which are incorporated by reference herein in its entirety.

TECHNICAL FIELD

The present disclosure relates generally to semiconductor memories, and more particularly to non-volatile memory structures and methods of operating the same.

BACKGROUND

A portion of a memory array of a conventional semiconductor memory having a two-transistor or 2T architecture or memory structure is shown in FIG. 1. Referring to FIG. 1 the portion of the memory array 102 includes four memory cells 104 arranged in two rows (ROW 0, ROW 1) and two columns ($COL_0$, $COL_1$). Each of the memory cells includes a non-volatile memory transistor 106, and a pass or select transistor 108 sharing a common substrate connection 110 with the memory transistor. The memory transistor 106 generally includes a charge trapping layer 112, a drain 114 connected to a bitline 116, a source 118 connected through the select transistor 108 to a source-line 120, and a control gate 122 connected to a control line or memory line 124. Select transistor 108 also includes a drain 126 connected to the source 118 of the memory transistor 106, a source 128 connected to the source-line 120, and a gate 130 connected to a wordline (WL) 132.

Referring to FIG. 2A, it is seen that each cell (202 and 204) in a conventional 2T memory structure includes a dedicated source-line (SL0 and SL1) formed from a first metal layer formed over or near diffusion regions 206, 208, in a surface of a substrate 210 in which active devices (transistors) of the memory cell are formed, and a bitline (BL0, BL1) formed from a second metal layer formed over a first or upper inter-level dielectric layer 212 separating the second metal layer from the source-lines (SL0 and SL1). Typically, as shown in FIG. 2B, the bitlines (BL0 and BL1) are electrically coupled to drains 214 of memory transistors in each cell (202 and 204) through first vias 216 and an island or pad 218 formed from the first metal layer, and second or lower vias 220 formed through a second or lower inter-level dielectric layer 222. The source-lines (SL0 and SL1) are also electrically coupled to sources (not shown in this figure) of select transistors in each cell (202 and 204) through lower vias extending through the lower inter-level dielectric layer 222. Thus, one problem with the conventional 2T memory structure is that despite advances in technology, which have enabled the size of active elements in the memory cell to be reduced to 65 nanometers (nm) and beyond, the reduction in pitch or spacing of adjacent memory cells in adjoining columns is limited by the width of the pad 218, the dedicated source-lines (SL0 and SL1) in each cell, and a spacing therebetween.

Another problem with conventional 2T architecture is that during programming the dedicated source-lines in non-selected memory cells or columns of memory cells are biased to or held at a potential that increases power consumption of the memory array.

Thus, there is a need for an improved memory structure as well as a method of operating the same.

SUMMARY

A memory structure is provided including a memory array of a plurality of memory cells arranged in rows and columns, the plurality of memory cells including a pair of adjacent memory cells in a row of the memory array, wherein the pair of adjacent memory cells include a single, shared source-line through which each of the memory cells in the pair of adjacent memory cells is coupled to a voltage source. Methods of operating a memory including the memory structure are also described.

BRIEF DESCRIPTION OF THE DRAWINGS

Embodiments of the present invention will be understood more fully from the detailed description that follows and from the accompanying drawings and the appended claims provided below, where:

DETAILED DESCRIPTION

The present disclosure is directed generally to a semiconductor memory with a memory structure including a pair of adjacent memory cells having a single, shared source-line, and methods for operating the same.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to couple as used herein may include both to directly electrically connect two or more components or elements and to indirectly connect through one or more intervening components.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

A memory array is constructed by fabricating a grid of memory cells arranged in rows and columns and connected by a number of horizontal and vertical control lines to peripheral circuitry such as address decoders and sense amplifiers. Each memory cell generally includes at least one trapped-charge non-volatile memory (NVM) transistor, and one or more select transistors.

Figure 3:
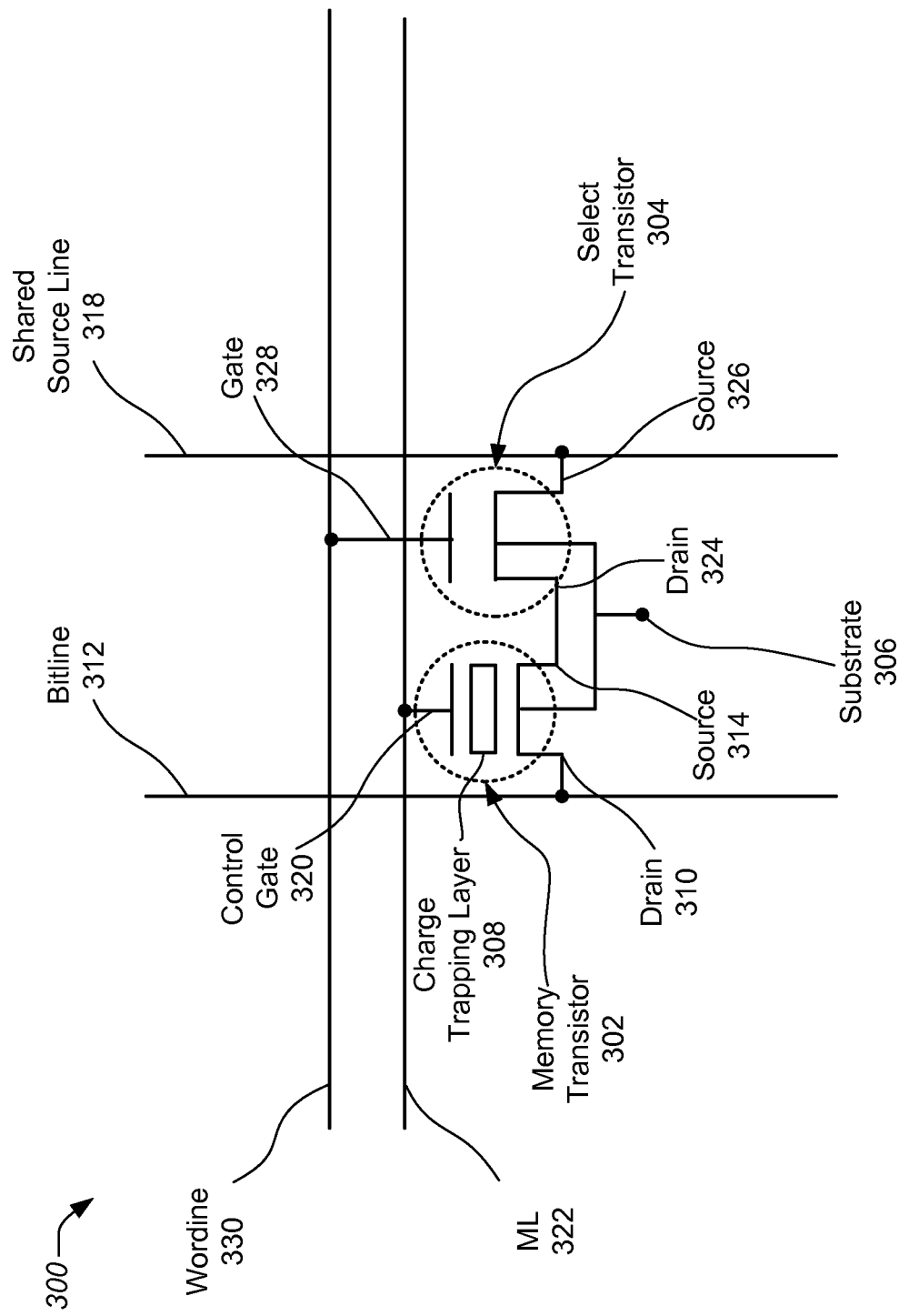
FIG. 3 is a schematic diagram illustrating a 2T memory cell according to an embodiment of the present disclosure.

In one embodiment, illustrated in FIG. 3, the memory cell 300 has a two-transistor (2T) architecture or memory structure and includes, in addition to a NVM transistor or memory transistor 302, a pass or select transistor 304, for example, an insulated-gate field-effect transistor (IGFET) sharing a common substrate connection 306 with the memory transistor 302. Referring to FIG. 3, the memory transistor 302 has a charge storing or charge trapping layer 308, a drain 310 connected to a bitline 312, a source 314 connected to a drain 324 of the select transistor 304 and, through the select transistor to a shared source-line 318, and a control gate 320 connected to a control line or memory line 322. Select transistor 304 also includes a drain 324 coupled to or sharing a common diffusion region with the source 314 of the memory transistor 302, a source 326 coupled to shared, source-line 318 and a gate 328 connected to a wordline (WL) 330.

The memory transistor can include a floating gate field effect transistor, in which the cell is programmed by inducing electrons onto a polysilicon floating gate or a silicon-oxide-nitride-oxide-silicon (SONOS) transistor. In a SONOS transistor a silicon nitride or silicon oxynitride is used instead of polysilicon as a charge storage material to program the memory cell.

A memory array of memory cells including pairs of adjacent memory cells having a single, shared source-line and methods of operating the same will now be described with reference to FIGS. 4, 5A and 5B. In the following description, for clarity and ease of explanation, it is assumed that all of the transistors in memory array are N-type transistors. It should be understood however, without loss of generality that a P-type configuration can be described by reversing the polarity of the applied voltages, and that such a configuration is within the contemplated embodiments of the invention. It will be further understood that the memory structure can alternatively include an embodiment in which the select transistor has a drain coupled to the bitline through a via, and a source coupled to the shared source-line through the memory transistor.

In addition, it will be appreciated that the voltages used in the following description are selected for ease of explanation and represent only one exemplary embodiment of the invention. Other voltages may be employed in different embodiments of the invention.

Figure 4:
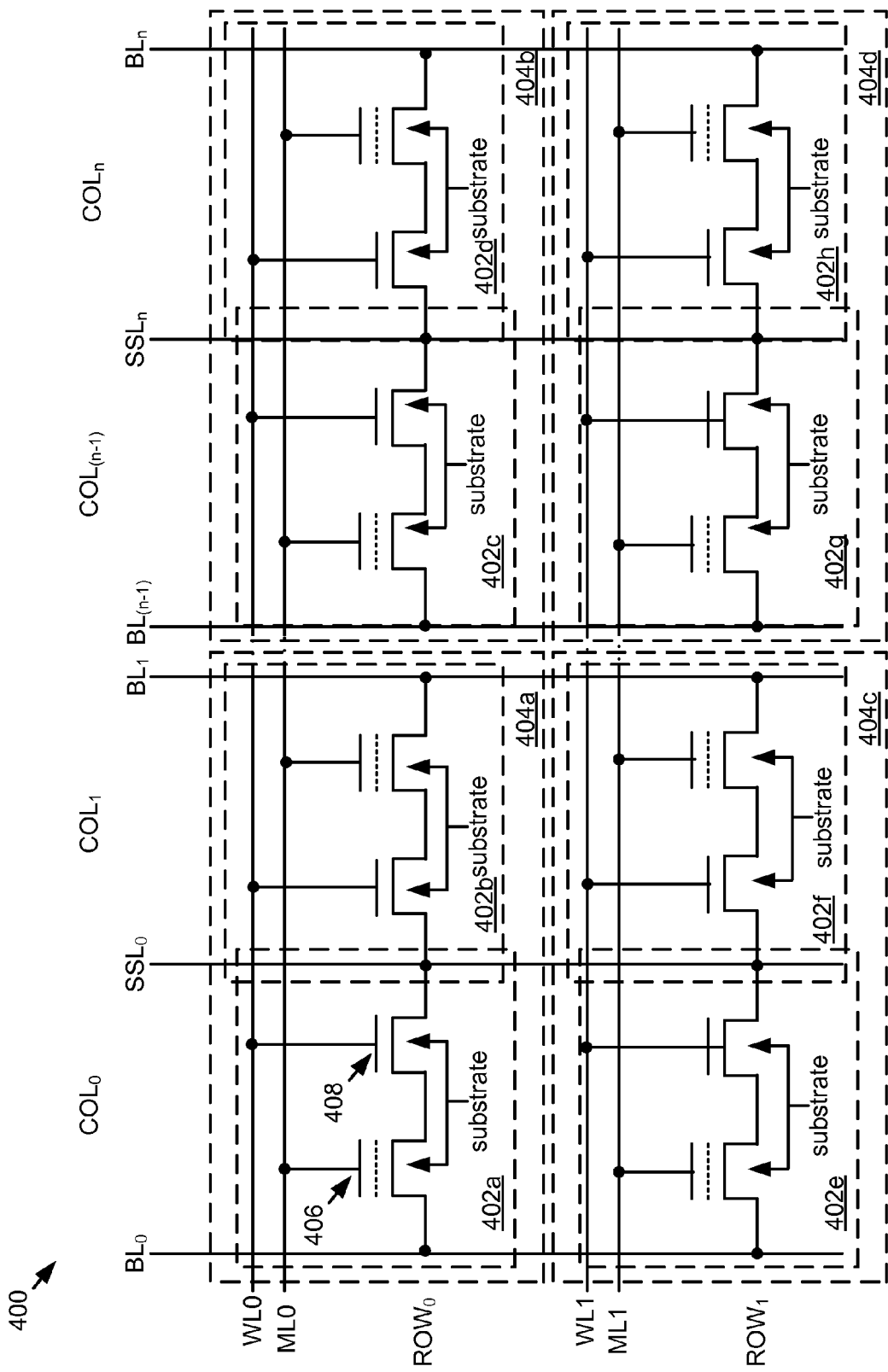
FIG. 4 is a schematic diagram illustrating a portion of a memory array of 2T memory cells for a semiconductor memory having a single, shared source-line according to an embodiment of the present disclosure.

FIG. 4 illustrates an exemplary embodiment of a segment of a memory array 400, which may be part of a large memory array of memory cells. In FIG. 4, memory array 400 includes eight memory cells 402a to 402h arranged in two rows (ROW$_0$, ROW$_1$) and four columns (COL$_0$, COL$_1$, COL$_{n-1}$, COL$_n$). In accordance with the memory structure of the present disclosure each of the memory cells 402a to 402h are further arranged into a number of pairs of adjacent memory cells 404a to 404d in the same row and in adjoining columns, each pair of adjacent memory cells including a single, shared source-line (SSL$_0$, SSL$_n$) between the memory cells of the adjacent pair of memory cells.

Each of the memory cells 402a-402h may be structurally equivalent to memory cell 300 described above, including a memory transistor 406 and a select transistor 408. Each of the memory transistors 406 includes a drain coupled to a bitline (BL$_0$ to BL$_n$), a source coupled to a drain of the select transistor 408 and, through the select transistor, to a single, shared source-line (SSL$_0$ to SSL$_n$), where indices are even numbers). Each memory transistor further includes a control gate coupled to a memory line (ML0, ML1). The select transistor 408 includes a source coupled to the shared source-line and a gate coupled to a wordline (WL0, WL1).

Figure 5A:
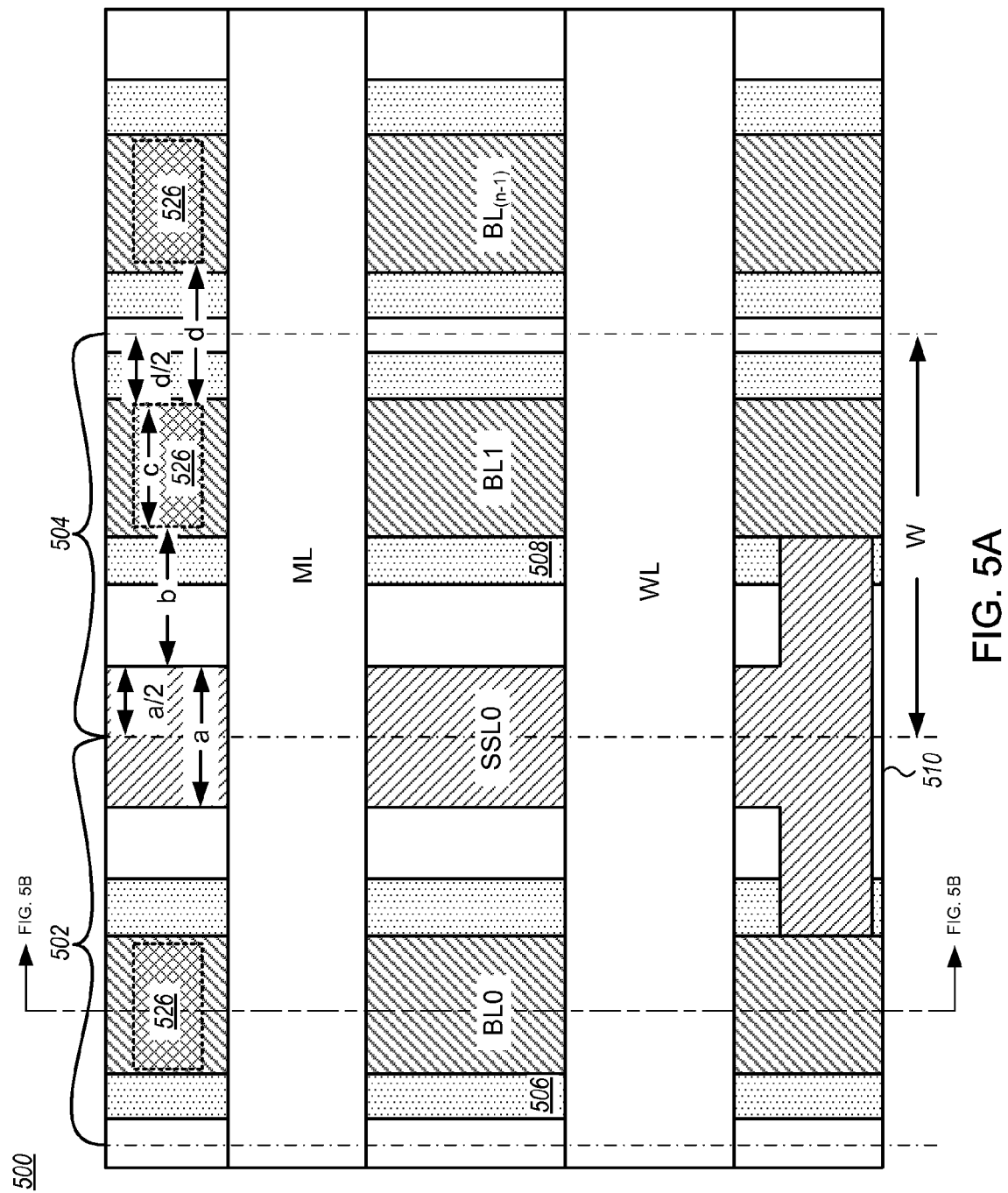
FIG. 5A is a block diagram illustrating a top view of a pair of adjacent memory cells having a single, shared source-line according to an embodiment of the present disclosure.

A block diagram illustrating a top view of a portion of a memory array 500 including a pair of adjacent memory cells, memory cell 502 and memory cell 504, having a single, shared source-line (SSL0) is shown in FIG. 5A. Referring to FIG. 5A, it is seen that each memory cell (502 and 504) includes diffusion regions 506, 508, formed in a surface of a substrate 510 in which active elements, such as the memory transistor and select transistor of the 2T memory cell described above, is formed, a bitline (BL0 or BL1), shared by all memory cells in a single column, and a single, shared source-line (SSL0). Additionally, each memory cell further includes a wordline (WL) and a memory line (ML), shared by all memory cells in a single row.

Figure 5B:
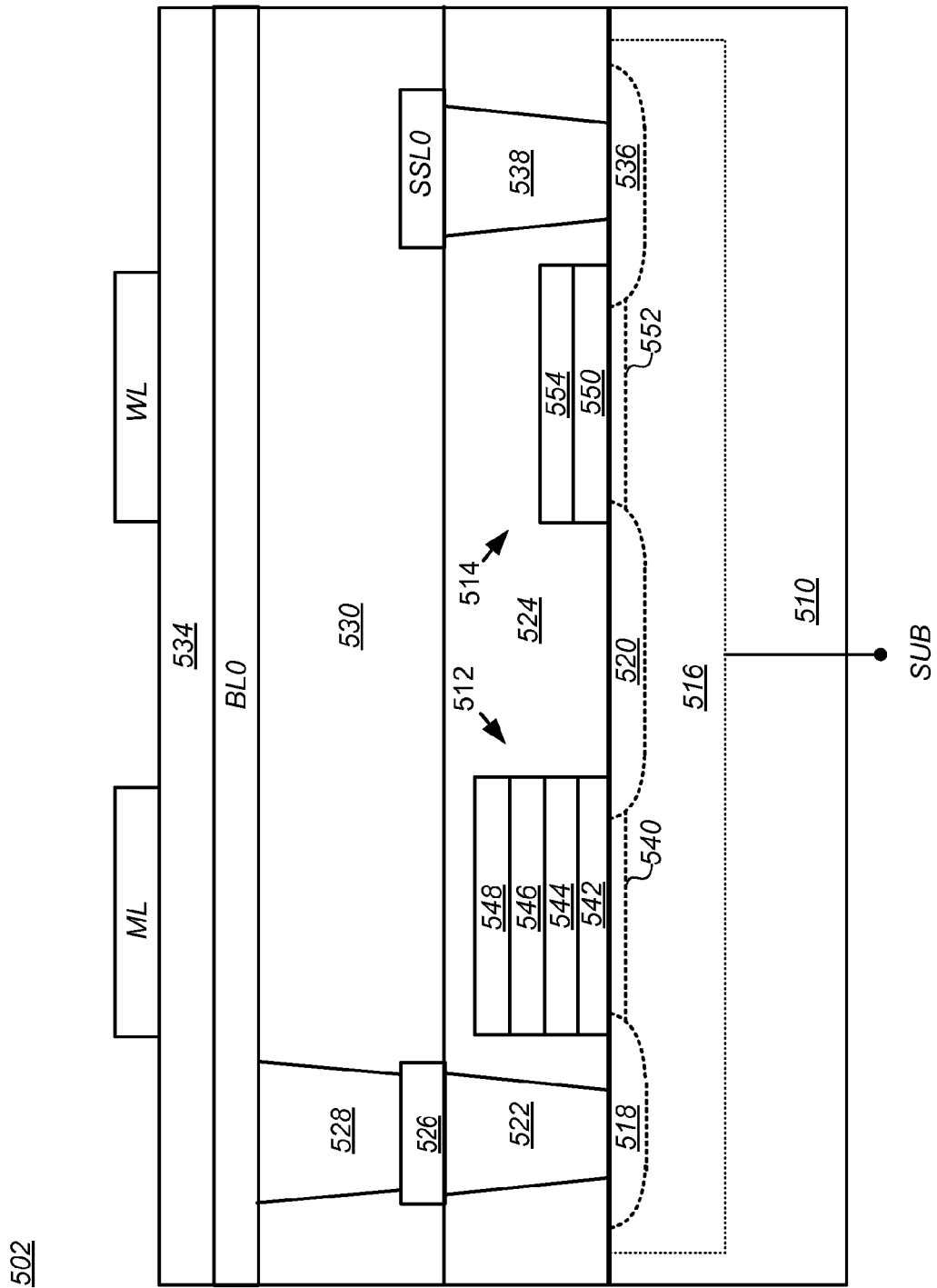
FIG. 5B is a block diagram illustrating a sectional view of one of the memory cells in the pair of adjacent memory cells of FIG. 5A.

FIG. 5B is a block diagram illustrating a sectional view of one of the memory cells 502 in the pair of adjacent memory cells 500 of FIG. 5A. Generally, as shown in FIG. 5B the memory cell 502 has a 2T architecture or memory structure, and includes a memory transistor 512 and a select transistor 514 formed in a well 516 in the substrate 510. The memory transistor 512 includes a drain 518 and a source formed in a source/drain diffusion region (S/D 520), which also forms a drain of the select transistor 514. The drain 518 of the memory transistor 512 is coupled to the bitline (BL0) through a lower or first via 522 extending through a lower or first inter-level dielectric (ILD) layer 524, an island or pad 526 formed from a patterned first metal layer, and an upper or second via 528 extending through an upper or second inter-level dielectric (ILD) layer 530. The bitline (BL0) is formed from a patterned second metal layer overlying the second ILD layer 530.

The select transistor 514 includes a source 532 directly coupled to the shared, source-line (SSL0), and the memory transistor 512 is coupled to the shared, source-line through the select transistor. Both the memory transistor 512 and the select transistor 514 share a common substrate connection (SUB) through the well 516, and are coupled to the memory line (ML) and the wordline (WL), respectively, through vias (not shown in the sectional view of FIG. 5B) extending through another inter-level dielectric layer (ILD) 534. The shared source-line (SSL0) is also formed from the patterned first metal layer deposited over the first ILD layer 524 and is in electrical contact with the source 536 of the select transistor 514 through a lower, third via 538.

Figure 1:
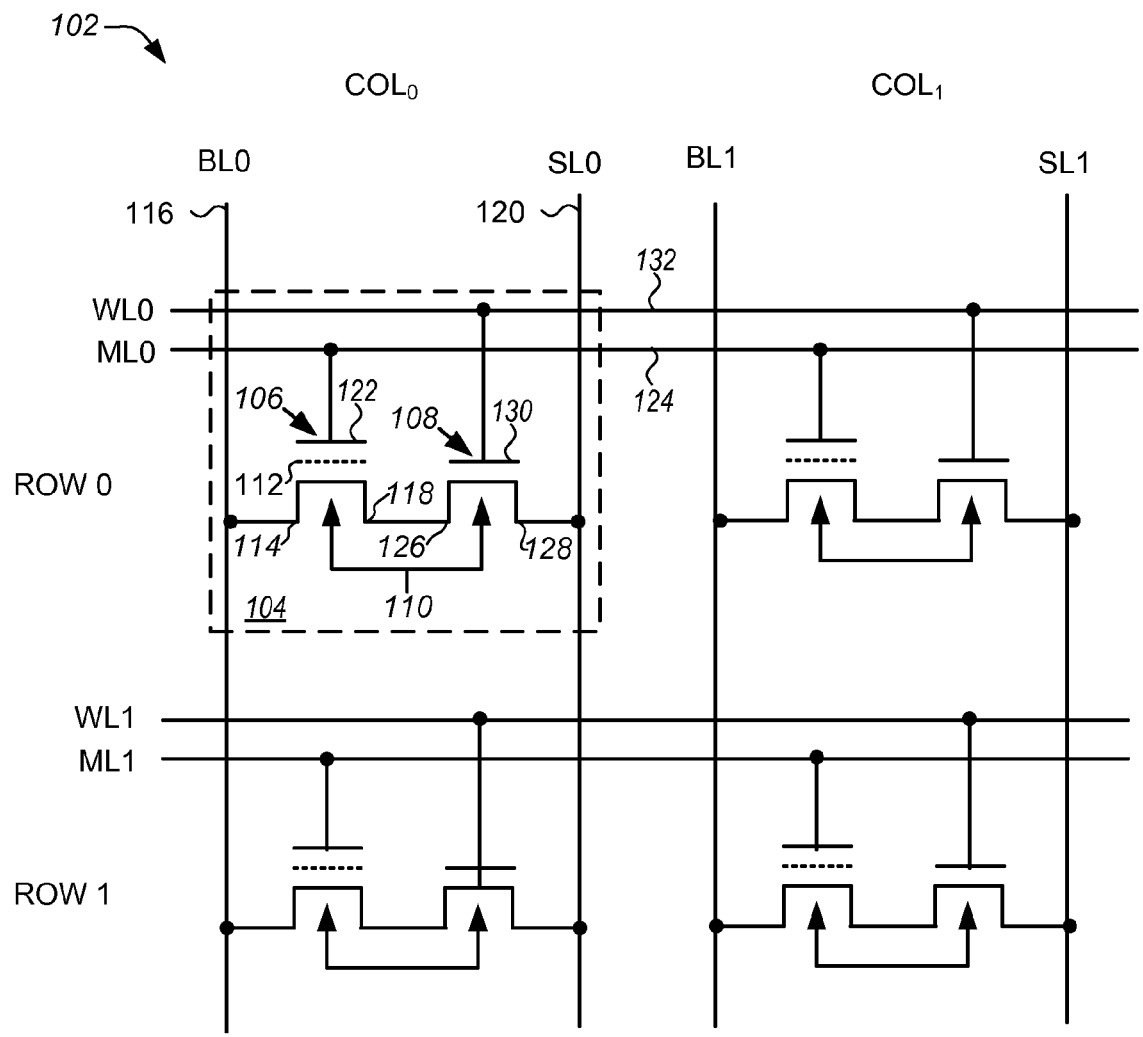
FIG. 1 is a schematic diagram illustrating a portion of a memory array of two transistor (2T) memory cells for a conventional semiconductor memory.
Figure 2A:
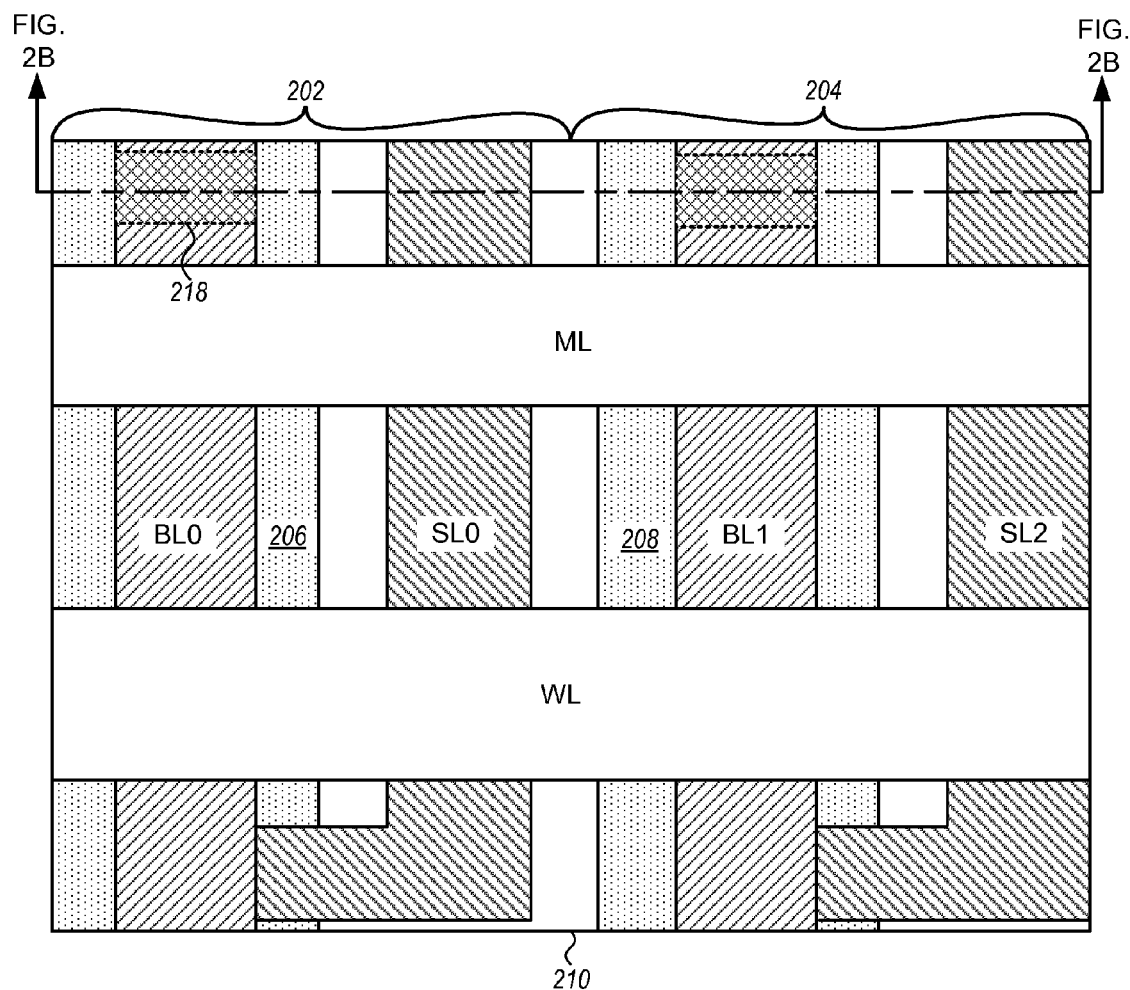
FIG. 2A is a block diagram illustrating a top view of two adjacent 2T memory cells for a conventional semiconductor memory.
Figure 2B:
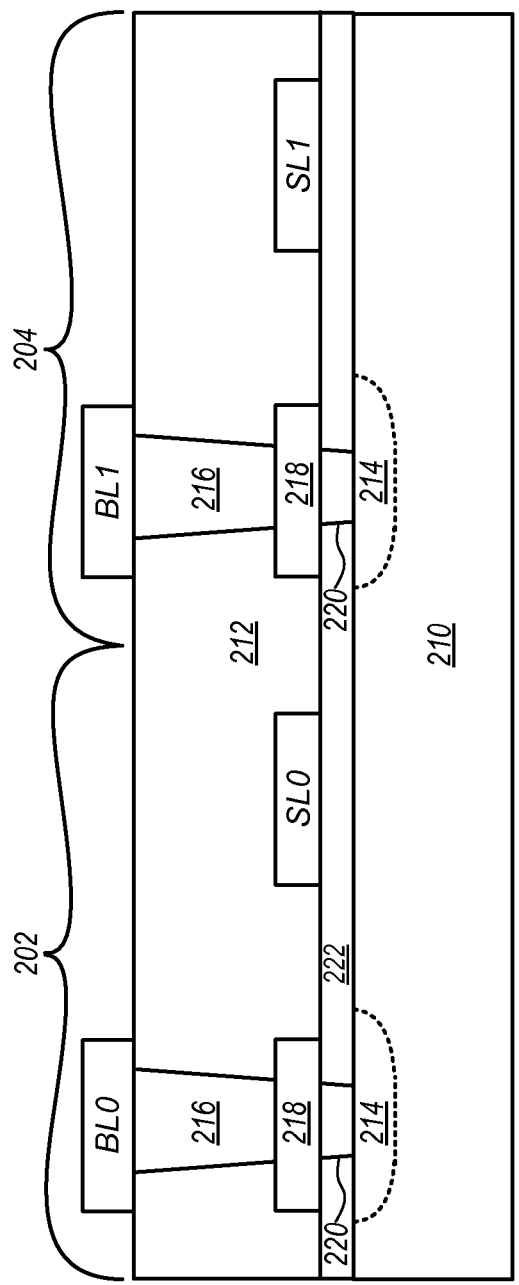
FIG. 2B is a block diagram illustrating a sectional view of the adjacent memory cells of FIG. 2A.

Referring again to FIG. 5A, in a memory structure having the 2T architecture of the present disclosure, a width (W) of each memory cell 502, 504, as well as a spacing or pitch between memory cells in a row of the memory array, is based on a half-width (a/2) of the shared source-line (SSL0), a width (c) of the pad 526, a first spacing (b) between the shared source-line and the pad, and a second half-spacing (d/2) between the pad and a pad coupling to a bitline ($BL_{(n-1)}$) of a memory cell in an adjacent pair of memory cells. Generally, the width (c) of the pad 526 is substantially equal to or the same as the width (a) of the shared source-line (SSL0), the spacing (b) between the shared source-line and the pad, and the spacing (d) between the pads in adjacent pairs of memory cells is substantially equal to from one to two times the width of the shared source-lines. However, unlike the conventional 2T memory structure described above with respect to FIGS. 2A and 2B, because the source-line (SSL0) is shared between the pairs of adjacent memory cells 502, 504, the width of each memory cell is reduced by at least the sum of about one half (½) of the width (a) of the shared source-line (SSL0) and about one half (½) of the spacing between the source line and the pad, or by about 25% of a width of a conventional memory cell having a dedicated source-line.

In one embodiment, the spacing (b) between the shared source-lines (SSL0 and SSL1) and the pad 526 is substantially equal to the width (a) of one of the shared source-lines (SSL0 or SSL1), the width (c) of the pad is substantially equal to one of the shared source-lines (SSL0 or SSL1), and the width (W) of each memory cell 502, 504, is substantially equal to a sum of (½) of the width (a) of the shared source-line (SSL0 or SSL1), the width (c) of the pad, the spacing (b) between the shared source-line and pad, and (½) of the spacing (d) between the two pads, or about three (3) times the width (a) of the shared source-line (SSL0 or SSL1). The width of the shared source-lines can be from about 40 to about 100 nanometers (nm), therefore each memory cell can have an average or effective width in a direction or width of the column, of from about 120 to about 300 nm.

Referring again to FIG. 5B, in the embodiment the memory transistor 512 is a SONOS-type non-volatile memory transistor and further includes a SONOS gate stack formed over a channel 540 in the substrate 510. The gate stack includes an oxide tunnel dielectric layer 542, a nitride or oxynitride charge-trapping layer 544, a top, blocking oxide layer 546 and a control gate 548 formed from a polysilicon (poly) or metal layer. Although not shown in FIG. 5B, it will be understood that the control gate 536 of the memory transistor 512 is electrically coupled to the memory line (ML) through a via or vertical contact extending through the second ILD layer 530, as shown schematically in FIGS. 3 and 4.

When the control gate 548 is appropriately biased, electrons from the drain 518 and source (S/D) 520 of the memory transistor 512, are injected or tunnel through tunnel dielectric layer 542 and are trapped in the charge-trapping layer 544. The mechanisms by which charge is injected can include both Fowler-Nordheim (FN) tunneling and hot-carrier injection. The charge trapped in the charge-trapping layer 544 results in an energy barrier between the drain and the source, raising the threshold voltage $V_T$ necessary to turn on a SONOS-type memory transistor 512 putting the device in a "programmed" state. The SONOS-type memory transistor 512 can be "erased" or the trapped charge removed and replaced with holes by applying an opposite bias on the control gate 548.

In another embodiment, the non-volatile trapped-charge semiconductor device can be a floating-gate MOS (FGMOS) field-effect transistor. Generally, a FGMOS-type memory transistor is similar in structure to the SONOS-type memory transistor described above, differing primarily in that a FGMOS-type memory transistor includes a poly-silicon (poly) floating gate, which is capacitively coupled to inputs of the device, rather than a nitride or oxynitride charge-trapping layer. Thus, the FGMOS-type memory transistor can also be described with reference to FIG. 5B. Referring to FIG. 5B, a FGMOS gate stack includes a tunnel dielectric layer 542, a floating gate layer 544, a blocking oxide or top dielectric layer 546 and a poly-silicon or metal layer which serves as a control gate 548.

Similarly to the SONOS-type memory transistor described above the FGMOS-type memory transistor 512 can be programmed by applying an appropriate bias between the control gate and the source and drain regions to inject charge into the floating gate layer, raising the threshold voltage $V_T$ necessary to turn on the FGMOS device. The FGMOS device can be erased or the charge on the floating gate removed by applying an opposite bias on the control gate.

The select transistor 514 includes a gate dielectric 550, such as a gate oxide (GOx) formed over a channel 552 in the substrate 510, and a gate 554 formed from a polysilicon (poly) or metal layer. Although not shown in FIG. 5B, it will be understood that the gate 554 of the select transistor 514 is electrically coupled to a wordline (WL) through a via or vertical contact extending through the first, second and third ILD layers, as shown schematically in FIGS. 3 and 4.

A method for operating a memory including the memory structure according to an embodiment of FIGS. 4, 5A and 5B will now be described with reference to those figures and to the flowchart of FIG. 6. Note, it will be understood that although all steps of the method are described individually below implying a sequential order, that is not necessarily the case, and that as shown in FIG. 6, a first five individual steps of the method are performed at substantially the same time, while a last step is performed after only a slight delay.

Figure 6:
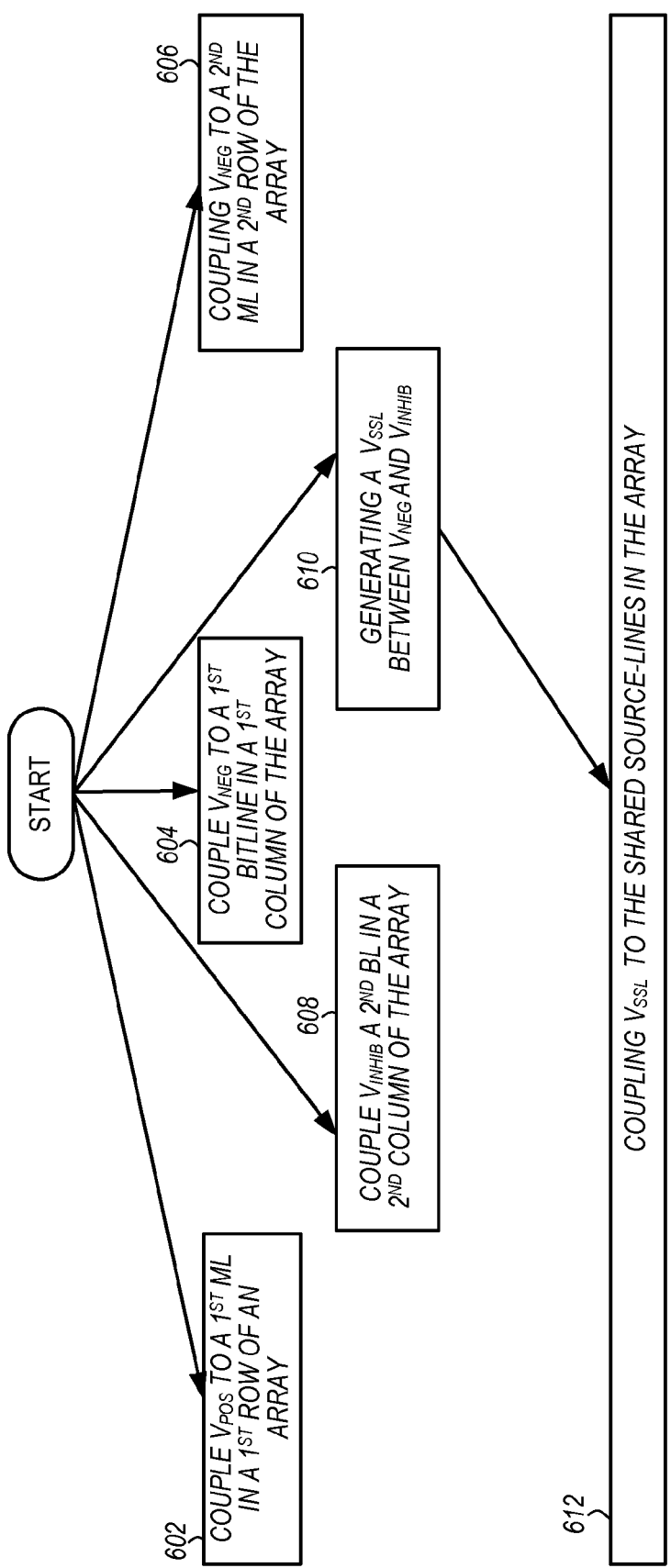
FIG. 6 is a flowchart illustrating a method for operating a memory including the memory structure according to an embodiment of the present disclosure.

Referring to FIG. 6, a first positive high voltage ($V_{POS}$) is coupled to a first memory line (ML0) in a first row (ROW0) of a memory array of memory cells (602). In the next operation or step, performed concurrently with the first, a negative high voltage ($V_{NEG}$) is coupled to a first bitline (BL0) in a first column ($COL_0$) of the memory array to apply a bias to a memory transistor 406 in a selected memory cell 402a to program the selected memory cell (604). Generally, $V_{NEG}$ may be coupled to a second memory line (ML1) in a second row (ROW1) of the memory array to apply a bias to a non-volatile memory transistor in a first unselected memory cell 402e in the first column and the second row of the memory array sharing the first bitline (BL0) with the selected memory cell 402a to reduce erase-state bitline disturb in the first unselected memory cell (606). $V_{NEG}$ may be coupled to wordlines (WL0, WL1) in the first and second rows (ROW0, ROW1) of the memory array, turning select transistors 408 off. An inhibit voltage ($V_{INHIB}$) is coupled to a second bitline (BL1) in a second column ($COL_1$) of the memory array to apply a bias to a non-volatile memory transistor in a second unselected memory cell 402b in the first row and second column to inhibit programming in the second unselected memory cell (608). Simultaneously, a bias voltage, referred to hereinafter as a shared source-line voltage ($V_{SSL}$), between $V_{NEG}$ and $V_{INHIB}$ is generated (610). In the next operation, after only a slight delay the shared source-line voltage ($V_{SSL}$) is coupled to the shared source-lines (SSL0-SSLn) of the memory array (612).

Optionally, in an alternative embodiment the shared source-lines (SSL0-SSLn) may instead be allowed to float during programming of the selected memory cell 402a. However, coupling the shared source-line voltage ($V_{SSL}$) to the shared source-lines (SSL0-SSLn) of the memory array, wherein the bias voltage is between $V_{NEG}$ and $V_{INHIB}$, minimizes a current consumed by the memory array during programming, and further minimizes program disturb of data in the unselected memory cell in the same row during programming of the first memory cell by coupling a bias voltage to the shared source-line, wherein the bias voltage is between $V_{NEG}$ and $V_{INHIB}$.

Generally, as illustrated in Table I below, $V_{SSL}$ is greater than $V_{NEG}$ and less than $V_{INHIB}$. Table I depicts exemplary bias voltages that may be used for programming a non-volatile memory having a 2T-architecture and including memory cells with a shared source-line and N-type SONOS transistors.

TABLE I

| $V_{POS}$ | $V_{NEG}$ | $V_{INHIB}$ | $V_{SSL}$ | Substrate Node |
|---|---|---|---|---|
| +4.7 V | −3.6 V | +1.2 V | −1.2 V ± 2.3 V | −3.6 V |

In embodiments such as that shown in FIG. 5B in which the memory transistors 512 and select transistors 514 are formed in wells 516 in the substrate 510, the wells may be coupled to $V_{NEG}$.

In some embodiments, the amplitude of the positive voltage ($V_{POS}$) received on the drain of the memory transistor 512 through the bitline (BL0) is selected in relation to the negative voltage ($V_{NEG}$) received at the control gate 548 of the memory transistor through a memory line (ML) to be sufficient to induce Fowler-Nordheim tunneling, thus programming the memory element using a Fowler-Nordheim tunneling-based technique, and changing one or more electrical properties of the charge storage layer or charge trapping layer 544 included in the memory transistor. This technique is particularly advantageous in programming memory structures and memory transistors 512 having smaller geometries or element sizes, such as in the memory structure of the present disclosure, as it enables programming to be performed using relatively low voltages compared with other techniques, such as channel hot electron programming, commonly used in conventional memory structures including dedicated source-lines and having larger architectures. The Fowler-Nordheim programming technique is also advantageous in because it uses significantly less power when compared to conventional techniques, such as channel hot electron programming. In some embodiments, the amplitude of the positive voltage ($V_{POS}$) may be between about 2V and 7V. For example, in the embodiment given in Table I above, the positive voltage ($V_{POS}$) may be about 4.7V.

During an erase operation to erase the memory cell 402a a negative high voltage ($V_{NEG}$) is applied to the memory line (ML0) and a positive high voltage ($V_{POS}$) applied to the bitline and the substrate connection (SUB). Generally, the memory cell 402a is erased as part of a bulk erase operation in which all memory cells in a selected row of a memory array are erased at once prior to a program operation to program the memory cell 402a by applying the appropriate voltages to the memory line (ML) shared by all memory cells in the row, the substrate connection and to all bitlines (BL0-BLn) in the memory array.

A processing system 700 having a memory structure including a single, shared source-line shared between adjacent memory cells and operated to reduce power consumption in the array and program disturbs according to an embodiment of the present disclosure will now be described with reference to FIG. 7.

Figure 7:
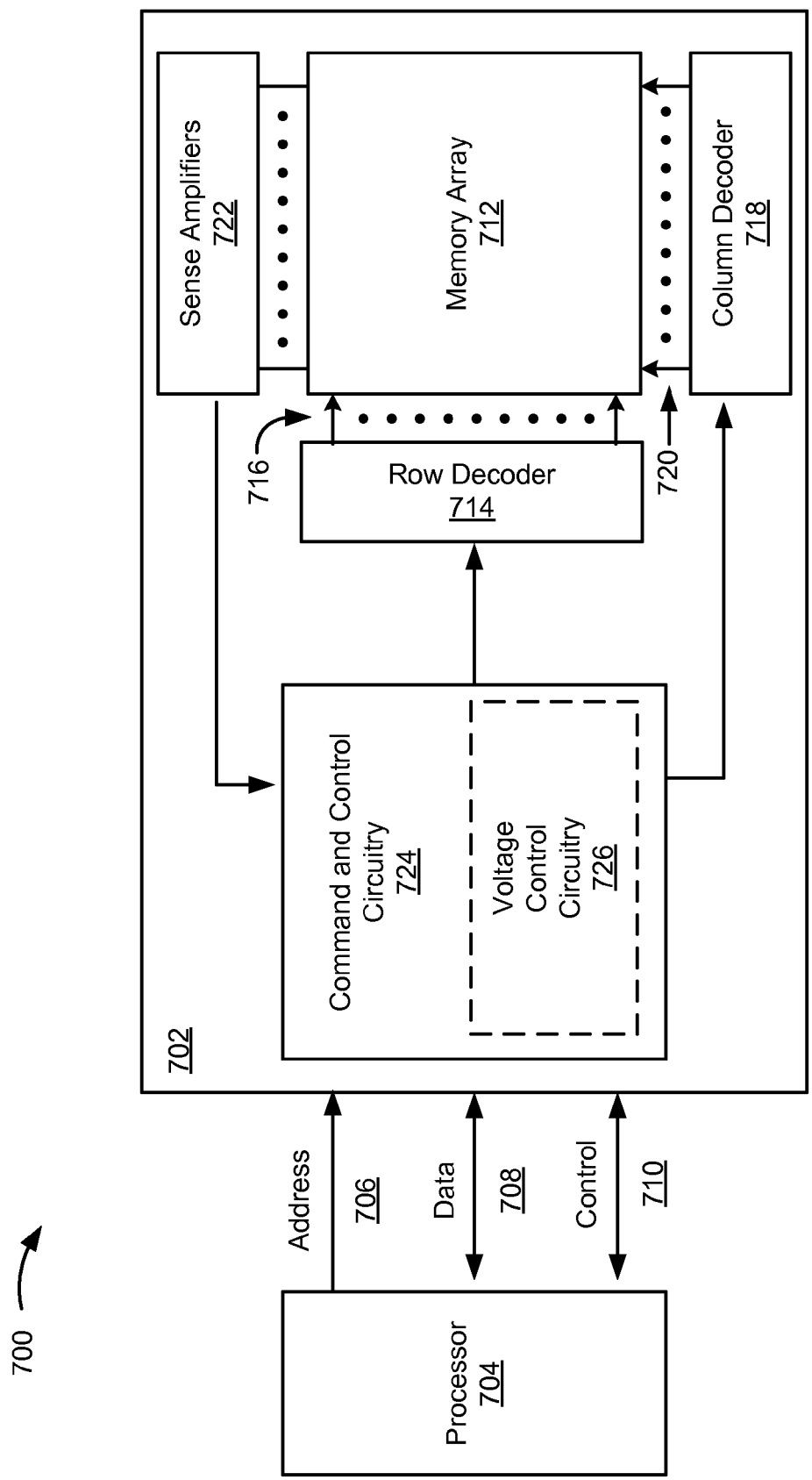
FIG. 7 is a block diagram illustrating a processing system including a memory structure according to an embodiment of the present disclosure.

Referring to FIG. 7 the processing system 700 generally includes a non-volatile memory 702 coupled to a processor 704 in a conventional manner via an address bus 706, a data bus 708 and a control bus 710. It will be appreciated by those skilled in the art that the processing system of FIG. 7 has been simplified for the purpose of illustrating the present invention and is not intended to be a complete description. In particular, details of the processor, row and column decoders, sense amplifiers and command and control circuitry, which are known in the art have are not described in detail herein.

The processor 704 may be a type of general purpose or special purpose processing device. For example, in one embodiment the processor can be a processor in a programmable system or controller that further includes a non-volatile memory, such as a Programmable System On a Chip or PSoC™ controller, commercially available from Cypress Semiconductor of San Jose, Calif.

The non-volatile memory 702 includes a memory array 712 organized as rows and columns of non-volatile memory cells (not shown in this figure) as described above. The memory array 712 is coupled to a row decoder 714 via multiple wordlines (WL) and memory lines (ML) lines 716 (at least one wordline and one memory line for each row of the memory array) as described above. The memory array 712 is further coupled to a column decoder 718 via a multiple bitlines and shared source lines 720 (one each for each pair of adjacent memory cells or pair of columns in the memory array) as described above. The memory array 712 is coupled to a plurality of sense amplifiers 722 to read multi-bit words therefrom. The non-volatile memory 702 further includes command and control circuitry 724 to control the row decoder 714, the column decoder 718 and sense amplifiers 722, and to receive read data from sense amplifiers. The command and control circuitry 724 includes voltage control circuitry 726 to generate the voltages needed for operation of the non-volatile memory 702, including $V_{POS}$, $V_{NEG}$ and $V_{SSL}$ described above, which is routed through the voltage control circuitry to the column decoder 718. The voltage control circuitry 726 operates to apply appropriate voltages to the memory cells during read, erase and program operations.

The command and control circuitry 724 is configured to control the row decoder 714 to select a first row of the memory array 712 for a program operation by applying the appropriate voltage ($V_{POS}$) to a first memory line ($ML_1$) in the first row and to deselect a second row of the memory array by applying the appropriate voltage ($V_{NEG}$) to a second memory line ($ML_2$) in the second row. The bitline in the selected memory cell is coupled to ($V_{NEG}$) while bitlines of the non-selected memory cells in other columns in the row are coupled to an inhibit voltage ($V_{INHIB}$). As described above, the shared source-lines of substantially all memory cells in all columns are allowed to float or are coupled to an appropriate shared source-line voltage ($V_{SSL}$) to reduce power consumption in the memory array 712, and/or to reduce the probability of a program disturb in the non-selected cells in the same row as the selected memory cell. The wordlines (WL) of both rows can be coupled to ($V_{NEG}$).

Thus, embodiments of memory structure including a pair of adjacent memory cells having a single, shared source-line, and methods for operating the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A memory structure comprising:
a memory array of a plurality of memory cells arranged in rows and columns, the plurality of memory cells including a first pair of adjacent memory cells in a row of the memory array,
wherein the first pair of adjacent memory cells comprise a first shared source-line formed from a first metal layer deposited over transistors in the memory cells through which each of the memory cells in the first pair of adjacent memory cells is coupled to a voltage source,
wherein the first metal layer further includes a first pad and a width of each memory cell in the row of the memory array is substantially equal to a sum of a ½ a width of the first shared source-line, a first spacing between the first shared source-line and the first pad, a width of the first pad, and a ½ a second spacing between the first pad and a second pad in a second pair of adjacent memory cells.

2. The memory structure of claim 1, wherein a pitch between memory cells in the row of the memory array is based substantially on a width of the first shared source-line and a spacing between the first shared source-line and a second shared source-line in a second pair of adjacent memory cells in the row in the memory array, the spacing substantially equal to twice the width of the first shared source-line.

3. The memory structure of claim 1, wherein a bitline formed from a second metal layer overlying the first metal layer is coupled to a diffusion region of the transistors in the memory cells through the first pad.

4. The memory structure of claim 3, wherein each of the memory cells in the pair of adjacent memory cells comprise a two-transistor (2T) architecture including a non-volatile memory (NVM) transistor and a select transistor.

5. The memory structure of claim 4, wherein the NVM transistor comprises a drain coupled to the bitline through a via, and a source coupled to the shared source-line through the select transistor.

6. The memory structure of claim 4, wherein the NVM transistor includes a charge trapping layer configured to change one or more electrical properties via Fowler-Nordheim tunneling in response to receiving a negative voltage ($V_{NEG}$) on the drain of the NVM transistor through the bitline, and receiving a positive voltage ($V_{POS}$) at a control gate of the NVM transistor through a memory line coupled thereto.

7. The memory structure of claim 4, wherein the select transistor comprises a drain coupled to the bitline through a via, and a source coupled to the shared source-line through the NVM transistor.

8. A memory structure comprising:
a memory array of a plurality of memory cells arranged in rows and columns, each of the memory cells in a pair of adjacent memory cells comprise a two-transistor (2T) architecture including a non-volatile memory (NVM) transistor and a select transistor,
wherein the plurality of memory cells include a first pair of adjacent memory cells in a row of the memory array, the first pair of adjacent memory cells comprising a first shared source-line formed from a first metal layer deposited over transistors in the memory cells through which each of the memory cells in the first pair of adjacent memory cells is coupled to a voltage source, and
wherein the first metal layer further includes a first pad, and a width of each memory cell in the row of the memory array is substantially equal to a sum of a ½ a width of the first shared source-line, a first spacing between the first shared source-line and the first pad, a width of the first pad, and a ½ a second spacing between the first pad and a second pad in a second pair of adjacent memory cells.

9. The memory structure of claim 8, wherein a bitline formed from a second metal layer overlying the first metal layer is coupled to a diffusion region of the transistors in the memory cells through the first pad.

10. The memory structure of claim 8, wherein the NVM transistor comprises a drain coupled to the bitline through a via, and a source coupled to the shared source-line through the select transistor.

11. The memory structure of claim 10, wherein the NVM transistor includes a charge trapping layer configured to change one or more electrical properties via Fowler-Nordheim tunneling in response to receiving a negative voltage ($V_{NEG}$) on the drain of the NVM transistor through the bitline, and receiving a positive voltage ($V_{POS}$) at a control gate of the NVM transistor through a memory line coupled thereto.

* * * * *